US008878327B2

(12) United States Patent
Yen et al.

(10) Patent No.: US 8,878,327 B2
(45) Date of Patent: Nov. 4, 2014

(54) SCHOTTKY BARRIER DEVICE HAVING A PLURALITY OF DOUBLE-RECESSED TRENCHES

(71) Applicant: Industrial Technology Research Institute, Hsinchu (TW)

(72) Inventors: Cheng-Tyng Yen, Kaohsiung (TW);
Young-Shying Chen, Hsinchu (TW);
Chien-Chung Hung, Hsinchu (TW);
Chwan-Ying Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/730,649

(22) Filed: Dec. 28, 2012

(65) Prior Publication Data

US 2014/0001489 A1 Jan. 2, 2014

(30) Foreign Application Priority Data

Jun. 27, 2012 (TW) .............................. 101123086 A (51) Int. Cl.
*H01L 27/095* (2006.01)
*H01L 29/47* (2006.01)
*H01L 29/812* (2006.01)
*H01L 31/07* (2012.01)
*H01L 29/04* (2006.01)
*H01L 31/036* (2006.01)
*H01L 31/108* (2006.01)
*H01L 29/80* (2006.01)
*H01L 31/112* (2006.01)
*H01L 31/00* (2006.01)
*H01L 29/66* (2006.01)
*H01L 29/872* (2006.01)

(52) U.S. Cl.
CPC .......... *H01L 29/872* (2013.01); *H01L 29/6606* (2013.01); *H01L 29/8725* (2013.01); *H01L 29/47* (2013.01)
USPC ............. 257/471; 257/73; 257/267; 257/280; 257/281; 257/284; 257/453; 257/473

(58) Field of Classification Search
CPC .............. H01L 29/1608; H01L 29/872; H01L 29/66143; H01L 29/00; H01L 29/8122; H01L 29/812; H01L 29/66848; H01L 31/08
USPC ............. 257/77, 73, 471, 155, 267, 280, 281, 257/284, 449, 453, 473, 474, 478
See application file for complete search history.

(56) References Cited

U.S. PATENT DOCUMENTS 5,262,668 A 11/1993 Tu et al.
5,612,567 A 3/1997 Baliga
(Continued)

FOREIGN PATENT DOCUMENTS

CN 102214603 A 10/2011
TW 200531292 A 9/2005
TW 201029116 A 8/2010

OTHER PUBLICATIONS

Östling et al., "SiC Power Devices—Present Status, Applications and Future Perspective," Proc. of the 23$^{rd}$ Int'l Symp. on Power Semiconductor Devices & ICs, pp. 10-15 (May 2011).

(Continued)

*Primary Examiner* — Matthew Reames
*Assistant Examiner* — Dilinh Nguyen
(74) *Attorney, Agent, or Firm* — Muncy, Geissler & Olds & Lowe, P.C.

(57) ABSTRACT

A Schottky barrier device includes a semiconductor substrate, a first contact metal layer, a second contact metal layer and an insulating layer. The semiconductor substrate has a first surface, and plural trenches are formed on the first surface. Each trench includes a first recess having a first depth and a second recess having a second depth. The second recess extends down from the first surface while the first recess extends down from the second recess. The first contact metal layer is formed on the second recess. The second contact metal layer is formed on the first surface between two adjacent trenches. The insulating layer is formed on the first recess. A first Schottky barrier formed between the first contact metal layer and the semiconductor substrate is larger than a second Schottky barrier formed between the second contact metal layer and the semiconductor substrate.

6 Claims, 8 Drawing Sheets

(56) References Cited

U.S. PATENT DOCUMENTS

| | | | |
|---|---|---|---|
| 7,504,306 | B2 | 3/2009 | Sapp et al. |
| 7,564,074 | B2 | 7/2009 | Sadaka et al. |
| 8,232,558 | B2 | 7/2012 | Zhang et al. |
| 8,304,783 | B2 | 11/2012 | Sriram et al. |
| 8,450,794 | B2 * | 5/2013 | Bhalla et al. .................. 257/328 |
| 2003/0020133 | A1 | 1/2003 | Dahlqvist et al. |
| 2004/0031971 | A1 | 2/2004 | Shimoida et al. |
| 2004/0173801 | A1 | 9/2004 | Willmeroth |
| 2005/0045892 | A1 | 3/2005 | Hayashi et al. |
| 2005/0167695 | A1 | 8/2005 | Yilmaz |
| 2007/0194375 | A1 | 8/2007 | Kawaguchi et al. |
| 2008/0099837 | A1 | 5/2008 | Akiyama et al. |
| 2008/0191304 | A1 | 8/2008 | Zhang et al. |
| 2008/0251793 | A1 | 10/2008 | Mazzola et al. |
| 2008/0277669 | A1 | 11/2008 | Okuno et al. |
| 2009/0261350 | A1 | 10/2009 | Yamamoto et al. |
| 2009/0289262 | A1 | 11/2009 | Zhang et al. |
| 2010/0289109 | A1 | 11/2010 | Henning et al. |
| 2010/0308337 | A1 | 12/2010 | Sriram et al. |
| 2013/0161736 | A1 | 6/2013 | Hung et al. |

OTHER PUBLICATIONS

Schoen et al., "A Dual-Metal-Trench Schottky Pinch-Rectifier in 4H-SiC," IEEE Electron. Dev. Letts., vol. 19, No. 4, pp. 97-99 (Apr. 1998).

Khemka et al., "A Fully Planarized 4H-SiC Trench MOS Barrier Schottky (TMBS) Rectifier," IEEE Electron. Dev. Letts., vol. 21, No. 5, pp. 286-288 (May 2000).

Yen et al., "Characteristics of 4H-SiC Dual-Metal and MOS Trench Schottky Rectifiers," pp. 1-3.

* cited by examiner

SCHOTTKY BARRIER DEVICE HAVING A PLURALITY OF DOUBLE-RECESSED TRENCHES

This application claims the benefit of Taiwan application Serial No. 101123086, filed Jun. 27, 2012, the disclosure of which is incorporated by reference herein in its entirety.

TECHNICAL FIELD

The disclosure relates in general to a Schottky barrier device, more particularly, and relates to a trench Schottky barrier device.

BACKGROUND

A Schottky barrier diode is an unipolar device in which electrons serve as the main charge carriers for transporting current. The device has a low forward voltage drop and a fast switching. However, the leakage current of Schottky diodes increases as reverse bias increases because of the lowering of Schottky barrier under high electric field. To reduce the leakage current at the reverse bias, a high work function metal is usually used to provide a high Schottky barrier, which will in turn increase the forward voltage drop and turn-on power loss of the device. The Schottky diode with a trench structure is one of solutions proposed to compromise above mentioned trade-offs. A trench-type Schottky diode usually comprises a plurality of mesas separated by a plurality of trenches. A Schottky contact with a lower barrier formed on the mesa provides a low forward voltage drop, while a metal-oxide-semiconductor (MOS) structure (the trench MOS controlled barrier Schottky diode, TMBS) or a Schottky contact with a higher barrier (the Schottky controlled barrier Schottky diode, TSBS) formed in the trenches shield the electric field on the low barrier contact and thus reduces the leakage current at the reverse bias.

Figure 1:
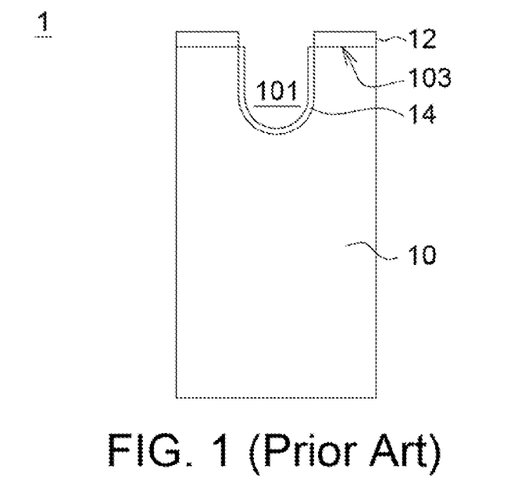
FIG. 1 (Prior Art) shows a schematic diagram of a TSBS diode.

FIG. 1 shows a schematic diagram of a TSBS diode. A trench 101 is formed at the semiconductor substrate 10, wherein a low Schottky barrier is formed on the mesa 103 by a contact metal 12 with a lower work function. Typically, a semiconductor substrate comprises a highly doped layer (as a cathode region) and a drift layer (not shown in FIG. 1), wherein the highly doped layer could be doped to a uniform first conductive type (such as n-type) dopant with concentration of about $1\times10^{19}$ cm$^{-3}$, and the drift layer (provided by epitaxial fabrication) may have a carrier concentration of $1\times10^{15}$ cm$^{-3}$~$1\times10^{17}$ cm$^{-3}$. A high Schottky barrier is formed in the trench 101 by a contact metal 14 with a higher work function. The TSBS diode utilizes the higher barrier Schottky contact within the trenches to shield the high electric field generated in the semiconductor drift region from the low barrier Schottky contact to reduce the leakage current at reverse bias.

Figure 2:
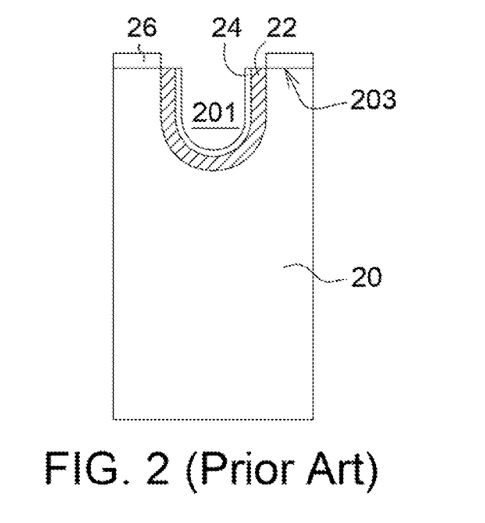
FIG. 2 (Prior Art) shows a schematic diagram of a TMBS diode.

FIG. 2 shows a schematic diagram of a TMBS diode. An insulating layer 22 and a metal layer 24 are formed in the trench 201 of the semiconductor substrate 20. A low Schottky barrier is formed on the mesa 203 by a contact metal 26 with a low work function. The metal layer 24, the insulating layer 22 and semiconductor of the substrate 20 form a metal-oxide-semiconductor (MOS) structure within the trench 201, the TMBS diode utilizes the depletion region formed by the MOS structure to shield the high electric field generated in the semiconductor drift region from the low barrier Schottky contact to reduce the leakage current at reverse bias. A thin insulating layer 22 is required to effectively generate the depletion region under the trench MOS structure at reverse bias, whereas a thick insulating layer 22 is formed to sustain the high electric field at high reverse bias because some of the applied reverse bias is supported across the oxide. When a TMBS device is made of silicon, the above mentioned problem is relatively minor because the breakdown strength of oxide is much larger than that of silicon (the breakdown strength of silicon is about 0.3 MV/cm, where the breakdown strength of silicon oxide (SiO$_2$) is around 8~10 MV/cm). However, when a TMBS device is made of a wide bandgap semiconductor material, such as silicon carbide (SiC), the reliability issue arose, because the breakdown strength of SiC (about 3 MV/cm) is on the same order of magnitude to that of SiO$_2$. If a thick insulating layer is used in the TMBS device to improve the reliability, the capability of effectively generating depletion region of the trench MOS structure deteriorated and the leakage current increased.

Although there is no hard breakdown for the TSBS of FIG. 1 as what may happen in the TMBS, the highest barrier Schottky contact achievable within the trenches limits the application of TSBS for high voltage rating SiC devices because of the barrier lowering effect caused by image force when a high electric field crowded around the trench corners.

Therefore, the silicon carbide Schottky diodes with voltage ratings higher than 600V mainly adopt junction barrier Schottky (JBS) structures. In the JBS structure, pn-junctions formed by spaced p+ regions implanted on the n-type silicon carbide drift layer using aluminum are used to generate depletion regions to shield the electric field from the Schottky contact to reduce leakage current under reverse bias. Nevertheless the implantation processes in SiC require an elevated temperature (400~700° C.) where normal photoresists are not adequate for masking and a hardmask made of oxide for example has to be used. Following the implantation processes, an ultra-high-temperature annealing (1600~1800° C.) is further necessary to active the dopants. These high temperature processes increase the manufacturing cost of SiC Schottky diodes.

SUMMARY

According to one embodiment, a Schottky barrier device including a semiconductor substrate, a first contact metal layer, a second contact metal layer and an insulating layer is provided. The semiconductor substrate has a first surface and a second surface positioned oppositely, and plural trenches are formed on the first surface. Each trench includes a first recess having a first depth and a second recess having a second depth. The second recess extends down from the first surface, while the first recess extends down from the second recess, and the first depth is larger than the second depth. The first contact metal layer is at least formed on the surface of the second recess. The second contact metal layer is formed on the first surface between two adjacent trenches. The insulating layer is formed on the surface of the first recess. A first Schottky barrier is formed between the first contact metal layer and the semiconductor substrate, and a second Schottky barrier is formed between the second contact metal layer and the semiconductor substrate, wherein the first Schottky barrier is larger than the second Schottky barrier.

The above and other aspects of the disclosure will become better understood with regard to the following detailed description of the preferred but non-limiting embodiment(s). The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A Schottky barrier device capable of providing low forward voltage drop, low reverse leakage current and improved device reliability is disclosed in the embodiments of the disclosure with reference to accompanying drawings. However, detailed structures of embodiment are exemplary and explanatory only, and are not for limiting the scope of protection of the disclosure. The drawings are simplified to highlight the features of the embodiment, and the dimensions of the drawings are not based on actual proportions of the product and are for reference only not for limiting the scope of protection of the disclosure.

First Embodiment

Figure 3:
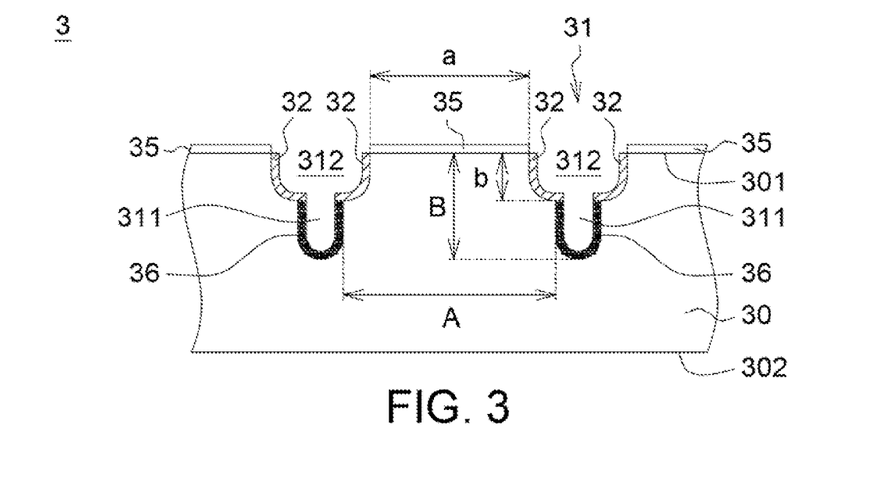
FIG. 3 shows a schematic diagram of a Schottky barrier device according to a first embodiment of the disclosure.

FIG. 3 shows a schematic diagram of a Schottky barrier device according to a first embodiment of the disclosure. The Schottky barrier device 3 includes a semiconductor substrate 30, a first contact metal layer 32, a second contact metal layer 35 and an insulating layer 36. The semiconductor substrate 30 has a first surface 301 and a second surface 302 positioned oppositely. A plurality of trenches 31 are formed on the first surface 301. Each trench 31 includes a first recess 311 having a first depth (B), and a second recess 312 having a second depth (b), wherein the second recess 312 extends down from the first surface 301, the first recess 311 extends down from the second recess 312, and the first depth (B) is larger than the second depth (b). Exemplary but not restrictively, the bottom of the first recess 311 of the present embodiment is rounded. As shown in FIG. 3, the first contact metal layer 32 is formed on the surface of the second recess 312, the second contact metal layer 35 is formed on the mesa between two adjacent trenches 31, that is, on the first surface 301, and the insulating layer 36 is formed on the surface of the first recess 311. A conductive material (not illustrated) may further be formed on the insulating layer 36, the first contact metal layer 32 and the second contact metal layer 35 to fill up the trenches 31, thereby constructing a metal-oxide-semiconductor structure within the first recess 311 to provide excellent electric contact. The first contact metal layer 32 and the semiconductor substrate 30 form a first Schottky contact having a first Schottky barrier. The second contact metal layer 35 and the semiconductor substrate 30 form a second Schottky contact having a second Schottky barrier. The first Schottky barrier is larger than the second Schottky barrier.

A semiconductor substrate comprises a highly doped layer (as a cathode region) and a drift layer (not shown in FIG. 3), wherein the highly doped layer could be doped to a uniform first conductive type (such as n-type) dopant with concentration of about $1\times10^{19}$ cm$^{-3}$, and the drift layer (provided by epitaxial fabrication) may have a carrier concentration of $1\times10^{15}$ cm$^{-3}$~$1\times10^{17}$ cm$^{-3}$. A buffer layer with a varying doping concentration can be further disposed between the highly doped layer and the drift layer to reduce the defects. It is noted that the term of semiconductor substrate used herein would be interpreted as the same meaning that is commonly understood by one of ordinary skill in the art to which the disclosure belong.

In an embodiment, material examples of the first contact metal layer 32 include nickel (Ni), gold (Au), platinum (Pt), palladium (Pd), erbium (Er), terbium (Tb), alloys or metal silicides comprising above metals, or other metals with suitable work function. Material examples of the second contact metal layer 35 include titanium (Ti), molybdenum (Mo), aluminum (Al), magnesium (Mg), tungsten (W), silver (Ag), alloys or metal silicides comprising above metals, and other metals with suitable work function. Both the first and the second Schottky contact may be formed by annealing at a proper temperature, for example 500° C., to improve the interfaces between the contact metal and the semiconductor. Examples of the insulating layer 36 include thermally grown oxide, deposited oxide, nitrides, oxynitrides, high-k dielectrics that can form MOS or metal-insulator-semiconductor (MIS) structures in the trenches.

In an embodiment, examples of the semiconductor substrate 30, formed by such as a silicon carbide (4H—SiC) substrate, include a n-type SiC layer/region with high doping concentration (n+ cathode region) and a n-type SiC epitaxial layer with low doping concentration for supporting reverse bias (as n– drift layer/region). A suitable metal, such as nickel (Ni), can be used to form an ohmic contact at the bottom surface of the n+ substrate after annealing at a suitable temperature, for example 950° C. The semiconductor substrate 30 may also be formed by other wide bandgap semiconductor material such as gallium nitride (GaN).

According to the Schottky barrier device 3 disclosed in the above embodiment, the first contact metal layer 32 and the semiconductor substrate 30 form a first Schottky contact at the second recess 312, the second contact metal layer 35 and the semiconductor substrate 30 form a second Schottky contact at the first surface 301, and a first Schottky barrier of the first Schottky contact is larger than a second Schottky barrier of the second Schottky contact. The second Schottky contact formed on the mesas of the first surface 301 has the lower second Schottky barrier, and provides a low forward voltage drop. At relatively low reverse bias, the first Schottky contact having the higher first Schottky barrier creates a potential barrier to shield the electric field on the second Schottky contact having the low Schottky barrier and reduces the leakage current. At a relatively high reverse bias, the depletion region created by the MOS/MIS structure at the first recess 311 shields the electric field on the first Schottky contact and the second Schottky contact, so as to maintain the leakage current at a low level. According to the structural design of the Schottky barrier device 3 of the embodiment, a thicker insulating layer 36 could be adopted to form the MOS/MIS structure at the first recess 311 with the existence of the first Schottky contact at the second recess 312. The Schottky barrier device 3 is capable of keeping the leakage current low under a high reverse bias and improving the device reliability due to the increased thickness of the insulating layer 36. Suitable thickness of the insulating layer may be determined by the intended applications and voltage ratings of devices, and can be, for example, referred to the settings of device simulations. However, the thickness of the insulating layer of the disclosure is not limited to the set values and may be adjusted according to actual needs. The settings of device simulations are not treated as the limitation for applying the present disclosure practically. Modifications and variations still can be made without departing from the spirit of the disclosure to meet the requirements of the practical applications. As indicated in FIG. 3, the ratio of a mesa width (a) (that is, the distance between two adjacent second recesses 312) to the second depth (b) of the second recess 312 is such as 2 (a/b=2); and the ratio of the width (A) between two adjacent first recesses 311 to the first depth (B) of the first recess 311 is such as 2 (A/B=2). It is understood that the ratios of a/b and A/B could be determined according to devices designed for different applications and voltage ratings, and the ratios for the practical application are not limited to the values disclosed herein.

Second Embodiment

Figure 4:
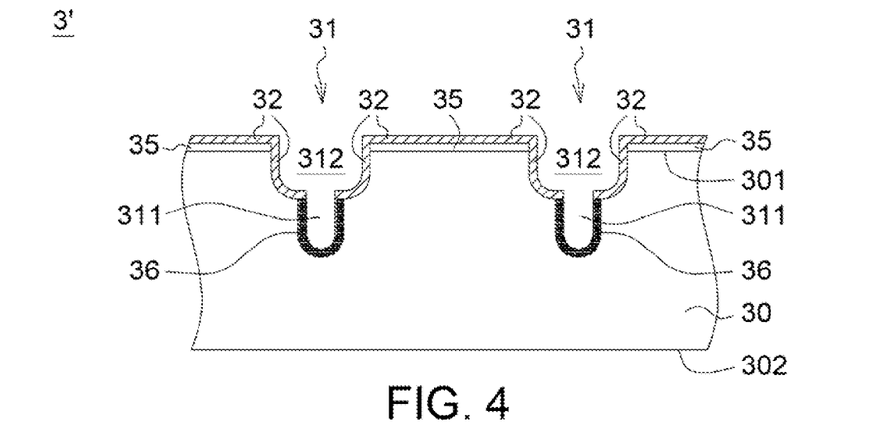
FIG. 4 shows a schematic diagram of a Schottky barrier device according to a second embodiment of the disclosure.

FIG. 4 shows a schematic diagram of a Schottky barrier device according to a second embodiment of the disclosure. Similar or common elements between the second embodiment and the first embodiment retain the same numeric designation, and the similarities are not repeated. The first contact metal layer 32 of the Schottky barrier device 3' of the second embodiment is formed on the second recess 312 and extends to cover the second contact metal layer 35.

Third Embodiment

Figure 5:
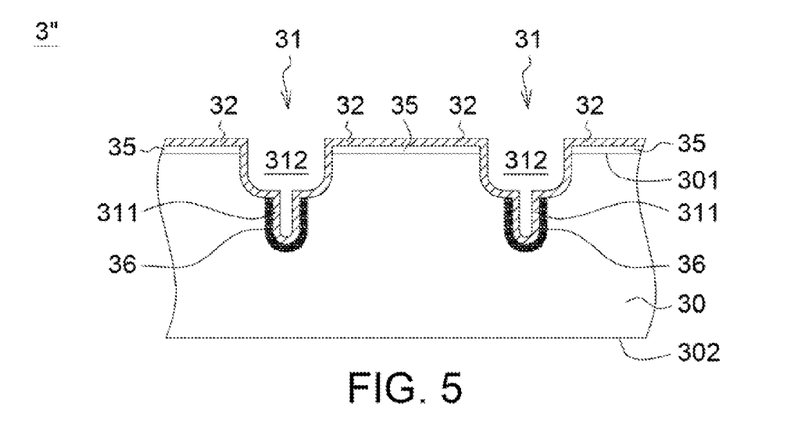
FIG. 5 shows a schematic diagram of a Schottky barrier device according to a third embodiment of the disclosure.

FIG. 5 shows a schematic diagram of a Schottky barrier device according to a third embodiment of the disclosure. Similar or common elements between the third embodiment and the first embodiment retain the same numeric designation, and the similarities are not repeated. The first contact metal layer 32 of the Schottky barrier device 3" of the third embodiment is formed on the second recess 312 and extends to cover the second contact metal layer 35 and also extends to cover the insulating layer 36.

In addition to the above three structures, other various modifications and variations can be made to the Schottky barrier devices of the above embodiments, and the disclosure is not limited thereto. For example, the second contact metal layer 35 of FIG. 3 could be modified by extending into the trenches 31 and covers the first contact metal layer 32 and insulating layer 36.

<Related Simulation Experiments>

In the disclosure, 2D numeric simulation experiments regarding element characteristics are performed with respect to various Schottky barrier devices. In the experiments, three types of Schottky barrier devices are considered: a trench Schottky controlled barrier Schottky (TSBS) diode (represented by the -●- curve), a trench MOS controlled barrier Schottky (TMBS) diode (represented by the -♦- curve), and a double-recessed trench Schottky barrier device (represented by the -■- curve) of the third embodiment of the disclosure. In the simulation experiments, the work functions for the first contact metal layer 32 and the second contact metal layer 35 of the double-recessed trench Schottky barrier device of the disclosure are set to be 5 and 4.3, respectively.

Figure 6:
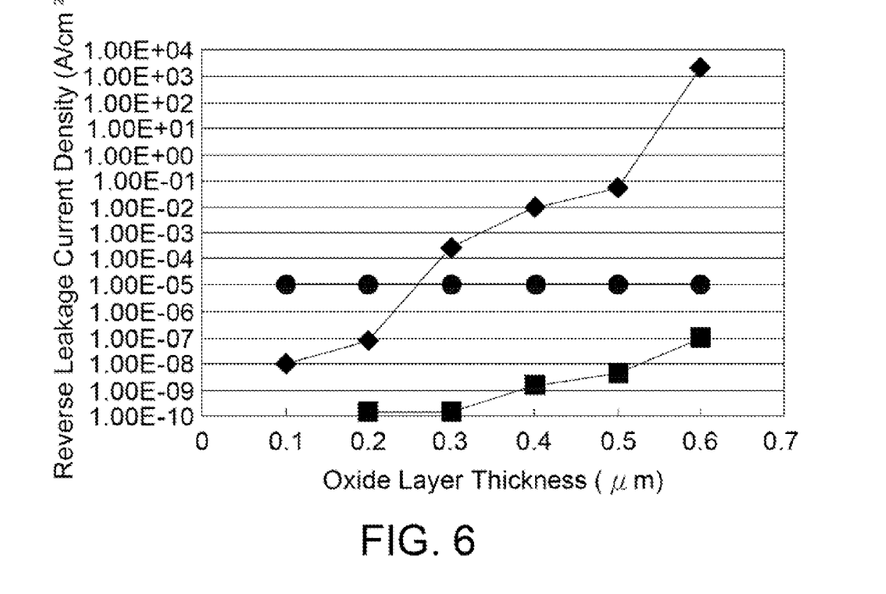
FIG. 6 shows three relationships of insulating layer thickness of a Schottky barrier device vs. reverse leakage current density.

FIG. 6 shows relationships between the trench insulating layer thickness and the reverse leakage current density for these three types of devices. Since the TSBS element does not have an insulating layer, a curve corresponding a leakage current density of $1\times10^{-5}$ A/cm$^2$ is shown for the purpose of comparison. FIG. 6 shows that the reverse leakage current density (about $1\times10^{-7}$ A/cm$^2$) of a double-recessed trench Schottky barrier device of the disclosure having a 0.6 μm of the insulating layer 36 (it is oxide here) at the first recess 311 is equivalent to that of a TMBS device having a 0.2 μm of the insulating layer.

Figure 7:
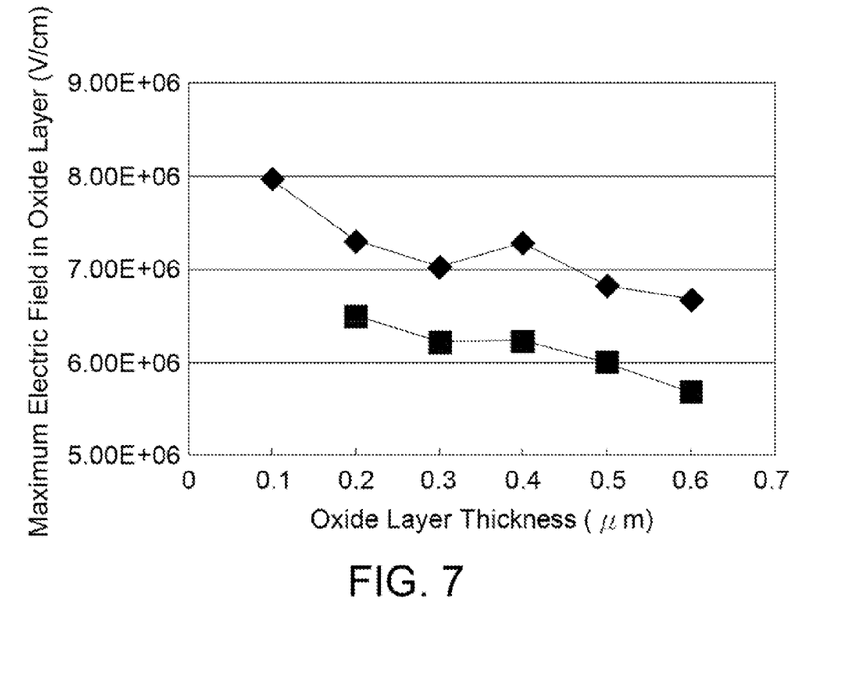
FIG. 7 shows relationships of insulating layer thickness of a Schottky barrier device vs. the largest intensity of electric field on an insulating layer of two types of the Schottky barrier devices.

FIG. 7 shows relationships between the insulating layer thickness and the largest electric field in the insulating layer for two types of the Schottky barrier devices. The -♦- curve represents the TMBS device, and the -■- curve represents the double-recessed trench Schottky barrier device of the disclosure. In the example of achieving about the same reverse leakage current density of $1\times10^{-7}$ A/cm$^2$, the TMBS device uses a 0.2 μm of the oxide layer (as the insulating layer), while the double-recessed Schottky barrier device of the disclosure uses a 0.6 μm of the oxide layer (as the insulating layer) (as shown in FIG. 6). FIG. 7 shows that the largest electric field in the 0.2 μm of the oxide layer of the TMBS device is about 7.3 MV/cm, while the largest electric field in the 0.6 μm of the oxide layer of the double-recessed Schottky barrier device of the disclosure is about 5.7 MV/cm, that is the largest electric field generated in the oxide layer of the TMBS element is about 30% larger than that generated in the oxide layer of the double-recessed Schottky barrier device of the disclosure. Thus, as compared to conventional TMBS devices, the double-recessed trench Schottky barrier device of the disclosure may provide stable reliability.

According to the aforementioned descriptions, the structural design of the double-recessed trench Schottky barrier device of the disclosure may adopt a thicker insulating layer 36. When the double-recessed trench Schottky barrier device of the disclosure is operated under a relatively small reverse bias, the depletion region created by the MOS/MIS structure of the thicker insulating layer 36 is unable to effectively shield the electric field on the low barrier second Schottky contact. However, the potential barrier created by the high barrier first Schottky contact may shield the low barrier Schottky contact against electric field to keep the leakage current low. When the double-recessed trench Schottky barrier device of the disclosure is operated under a relatively large reverse bias, the MOS/MIS structure of the insulating layer 36 creates a depletion region large enough to effectively shield the electric field on both of the Schottky contacts to maintain the leakage current at a low level. A comparison between the double-recessed Schottky barrier device of the disclosure and the conventional TMBS device shows that for a same leakage current level, the double-recessed Schottky barrier device of the disclosure may use a thicker insulating layer 36, thereby reduce the largest electric field within the insulating layer. Thus the Schottky barrier device of the disclosure is able to provide a low forward voltage drop, a lower reverse leakage current and improved device reliability.

<Manufacturing Method of Schottky Barrier Device>

A manufacturing method of the Schottky barrier device of the third embodiment is disclosed below for exemplary and explanatory purposes not for limiting the disclosure. Detailed procedures including manufacturing sequence and implementation of each step could be varied, depending on the structure of the Schottky barrier device used in practical application (for example, the structure can be the Schottky barrier device as disclosed in the first and the second embodiment or the one with modification or variation), and corresponding modifications and variations can be made to the manufacturing method accordingly.

Figure 8A:
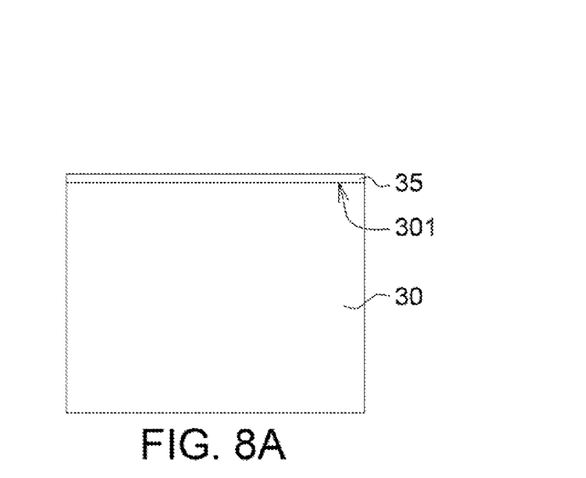
FIG. 8A-FIG. 8M illustrate a method of manufacturing a Schottky barrier device according to a third embodiment of the disclosure.

FIG. 8A-FIG. 8M illustrate a method of manufacturing a Schottky barrier device according to the third embodiment of the disclosure. Firstly, as indicated in FIG. 8A, a semiconductor substrate 30 is provided, and a second contact metal layer 35 is formed on the first surface 301 of the semiconductor substrate 30. Similarly, the term of semiconductor substrate used herein may comprise a highly doped layer (as a cathode region with a high concentration of about $1\times10^{19}$ $cm^{-3}$ of the first conductive type (such as n-type) dopant) and a drift layer (may having a carrier concentration of $1\times10^{15}$ $cm^{-3}\sim1\times10^{17} cm^{-3}$), and would be interpreted as the meaning that is commonly understood by one of ordinary skill in the art to which the disclosure belong. Before forming the second contact metal layer 35, the semiconductor substrate 30 could be optionally subjected to surface cleaning (such as RCA clean) and pre-treatment (such as the growth and removal of a sacrificial insulating layer) processes.

Figure 8B:
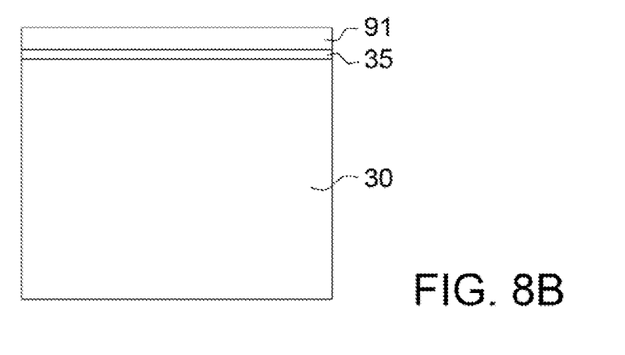
Figure 8C:
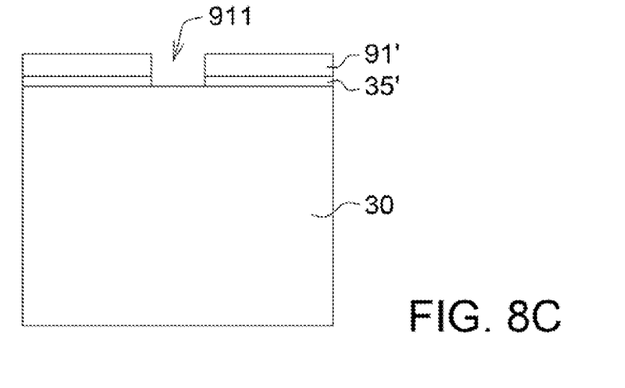

Next, as shown in FIG. 8B, a hard mask 91 such as silicon dioxide is deposited on the second contact metal layer 35. Then, as indicated in FIG. 8C, an opening 911 is formed on the hard mask 91 to form a first patterned hard mask 91', which is further used to etch the second contact metal layer 35 to form a patterned second contact metal layer 35'.

Figure 8D:
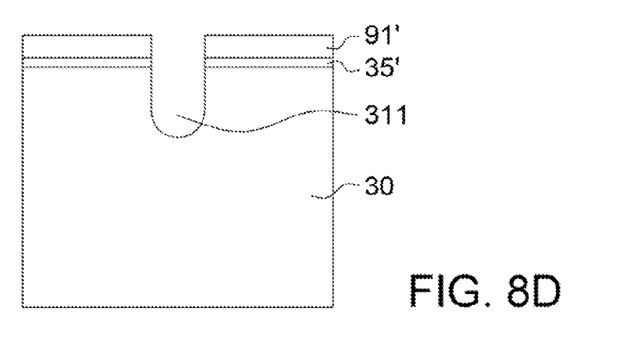
Figure 8E:
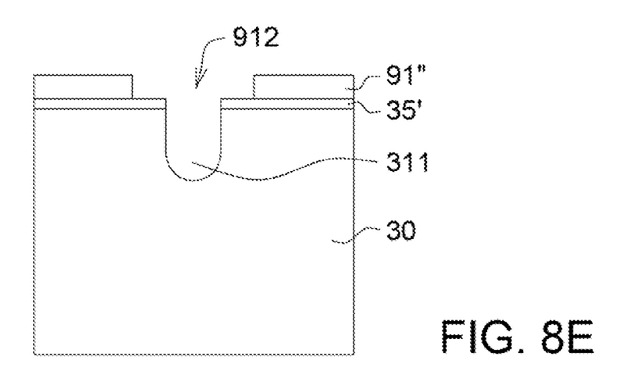

As shown in FIG. 8D, the semiconductor substrate 30 are etched according to the first patterned hard mask 91' and the patterned second contact metal layer 35' to form a first recess 311. Then, a tank 912 is self-alignedly formed on the first patterned hard mask 91' by an etching back process using a recipe with a proper selectivity between silicon dioxide and titanium (etching rate of oxide faster than titanium). Meanwhile, the second patterned hard mask 91" exposes a part of the surface of the patterned second contact metal layer 35' as shown in FIG. 8E. The width of the tank 912 is larger than the width of the opening 911.

Figure 8F:
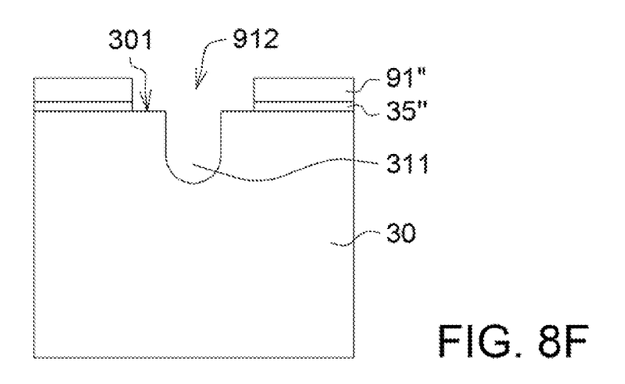

Afterwards, as shown in FIG. 8F, a part of the first surface 301 of the semiconductor substrate 30 is exposed by etching the patterned second contact metal layer 35" with the second patterned hard mask 91".

Figure 8G:
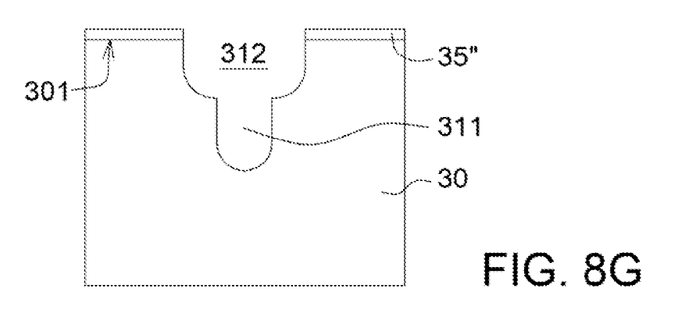

Then, as shown in FIG. 8G, the semiconductor substrate 30 is etched according to the tank 912 of the second patterned hard mask 91" to form a second recess 312 that extends down from the first surface 301 and the first recess 311 is positioned under the second recess 312 having a smaller aperture width.

Figure 8H:
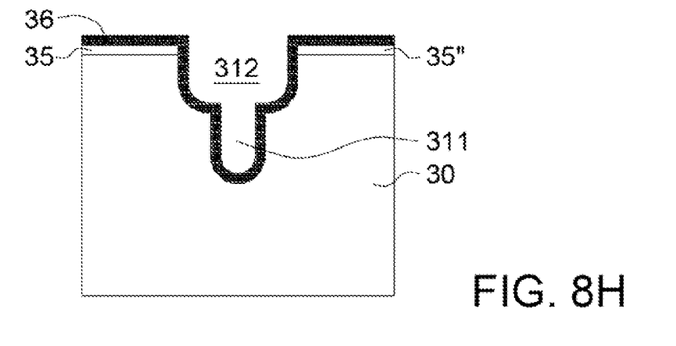

Then, as shown in FIG. 8H, an insulating layer 36 is deposited on the semiconductor substrate 30 and the patterned second contact metal layer 35".

Figure 8I:
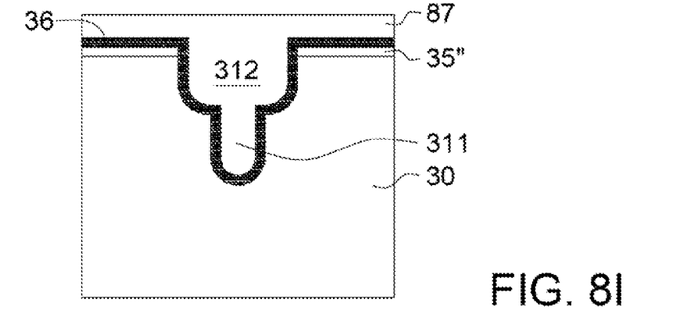
Figure 8J:
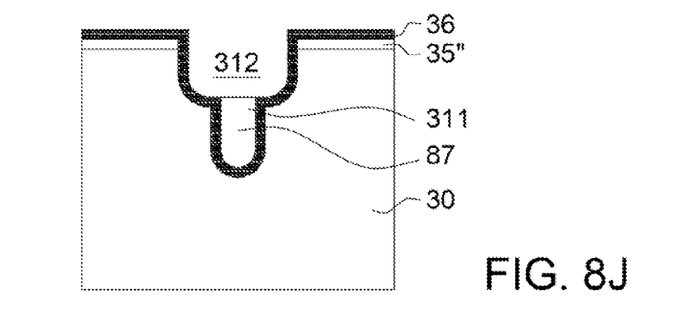

As shown in FIG. 8I, a photoresist 87 is deposited on the semiconductor substrate 30 by for example, a spin-coating process. The photoresist 87 disposed inside the second recess 312 and on the first surface 301 is then removed by the etching back process, as shown in FIG. 8J.

Figure 8K:
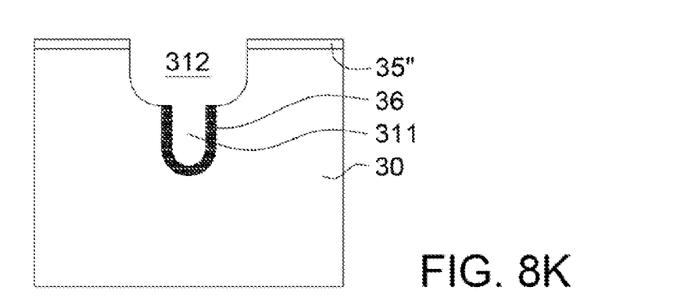

As shown in FIG. 8K, portions of the insulating layer 36 disposed outside the first recess 311 are removed by the etching back process, followed by removing the photoresist 87 inside the first recess 311.

Figure 8L:
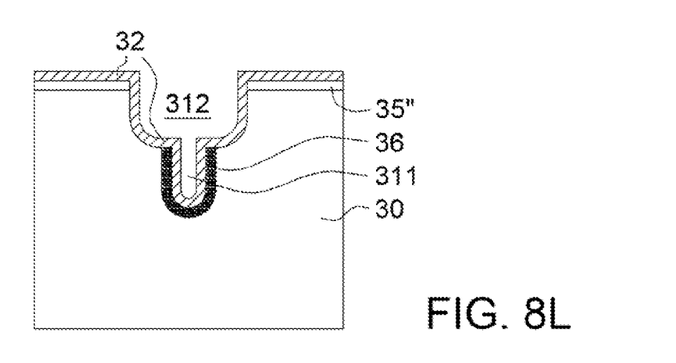
Figure 8M:
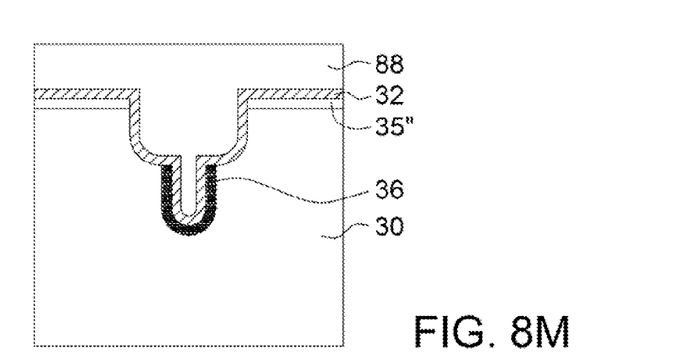

As shown in FIG. 8L, a first contact metal layer 32 is deposited on the semiconductor substrate 30, covering the patterned second contact metal layer 35" and the insulating layer 36. Then, a conductive layer 88 is formed on the semiconductor substrate 30 covering the first contact metal layer 32 and filling the first recess 311 and the second recess 312 as shown in FIG. 8M.

The disclosure is a double-recessed trench Schottky barrier device capable of well pinching the reverse leakage current and increasing the device reliability.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A Schottky barrier device, comprising:
a semiconductor substrate, having a first surface and a second surface positioned oppositely, and a plurality of trenches formed on the first surface, each trench comprising a first recess having a first depth and a second recess having a second depth, the second recess extending down from the first surface, the first recess extending down from the second recess, and the first depth larger than the second depth;
a first contact metal layer at least formed on a surface of the second recess;
a second contact metal layer formed on the first surface and between two adjacent trenches; and
an insulating layer formed on a surface of the first recess, wherein the first contact metal layer extends to cover the second contact metal layer,
wherein a first Schottky barrier is formed between the first contact metal layer and the semiconductor substrate, a second Schottky barrier is formed between the second contact metal layer and the semiconductor substrate, and the first Schottky barrier is larger than the second Schottky barrier.

2. The Schottky barrier device according to claim 1, wherein a material of the semiconductor substrate comprises silicon carbide (SiC) or gallium nitride (GaN).

3. The Schottky barrier device according to claim 1, wherein the first contact metal layer extends to cover the insulating layer.

4. The Schottky barrier device according to claim 1, wherein a bottom of the first recess is rounded.

5. The Schottky barrier device according to claim 1, wherein the material of the first contact metal layer comprises nickel, gold, platinum, palladium, erbium, terbium, or an alloy or a metal silicide of the above metals.

6. The Schottky barrier device according to claim 1, wherein the material of the second contact metal layer comprises titanium, molybdenum, aluminum, magnesium, tungsten, silver, or an alloy or a metal silicide of the above metals.

* * * * *